US011095264B2

(12) United States Patent
Schindler et al.

(10) Patent No.: US 11,095,264 B2
(45) Date of Patent: Aug. 17, 2021

(54) CONFIGURABLE MODAL AMPLIFIER SYSTEM

(71) Applicant: Dolby Laboratories Licensing Corporation, San Francisco, CA (US)

(72) Inventors: Kenneth Schindler, Alameda, CA (US); Scott P. Robinson, Sausalito, CA (US); Joel A. Butler, Springfield, MO (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 16/957,051

(22) PCT Filed: Dec. 19, 2018

(86) PCT No.: PCT/US2018/066544
§ 371 (c)(1),
(2) Date: Jun. 22, 2020

(87) PCT Pub. No.: WO2019/126351
PCT Pub. Date: Jun. 27, 2019

(65) Prior Publication Data
US 2020/0395908 A1    Dec. 17, 2020

Related U.S. Application Data

(60) Provisional application No. 62/608,465, filed on Dec. 20, 2017.

(30) Foreign Application Priority Data

Feb. 12, 2018   (EP) ..................................... 18156223

(51) Int. Cl.
*H03F 3/68* (2006.01)
*H03F 1/02* (2006.01)
(Continued)

(52) U.S. Cl.
CPC ............. *H03F 3/68* (2013.01); *H03F 1/0266* (2013.01); *H03F 1/307* (2013.01); *H03F 3/183* (2013.01);
(Continued)

(58) Field of Classification Search
CPC ....................................................... H03F 3/68
See application file for complete search history.

(56) References Cited

U.S. PATENT DOCUMENTS 4,218,660 A   8/1980 Carver
4,346,349 A   8/1982 Yokoyama
(Continued)

FOREIGN PATENT DOCUMENTS

EP        2755322        7/2014
WO     1999005785        2/1999
(Continued)

*Primary Examiner* — Patricia T Nguyen

(57) ABSTRACT

Configurable amplifier systems are described in which the power supply rail of a linear amplifier, e.g., a class A amplifier, is modulated by a switching amplifier, e.g., a class D amplifier, that may also be configured to operate independently of the linear amplifier. Techniques are also described by which the standing current of the output stage of a linear amplifier is modulated based on the input signal to the linear amplifier or based on modulation of the power supply rail of the linear amplifier.

19 Claims, 9 Drawing Sheets

(51) Int. Cl.
*H03F 1/30* (2006.01)
*H03F 3/183* (2006.01)
*H03F 3/217* (2006.01)
*H03F 3/30* (2006.01)

(52) U.S. Cl.
CPC ......... *H03F 3/2173* (2013.01); *H03F 3/3076* (2013.01); *H03F 2200/432* (2013.01)

(56) References Cited

U.S. PATENT DOCUMENTS

| | | | |
|---|---|---|---|
| 4,445,095 A * | 4/1984 | Carver | H03F 1/0227 330/297 |
| 5,200,711 A * | 4/1993 | Andersson | H03F 1/0227 330/267 |
| 5,875,250 A | 2/1999 | Kuo | |
| 5,892,404 A | 4/1999 | Tang | |
| 6,166,605 A | 12/2000 | Carver | |
| 6,373,335 B1 | 4/2002 | Carver | |
| 8,995,691 B2 * | 3/2015 | French | H03F 1/304 381/120 |
| 2006/0186955 A1 | 8/2006 | Quilter | |
| 2006/0284673 A1 | 12/2006 | Peruzzi | |
| 2007/0018719 A1 | 1/2007 | Seven | |
| 2008/0252372 A1 | 10/2008 | Williams | |
| 2008/0310046 A1 * | 12/2008 | Menegoli | G11B 21/02 360/75 |
| 2015/0188432 A1 * | 7/2015 | Vannorsdel | H02M 3/156 323/271 |
| 2015/0296293 A1 | 10/2015 | Hogan | |
| 2017/0033811 A1 * | 2/2017 | Heo | H03F 3/24 |

FOREIGN PATENT DOCUMENTS

| | | |
|---|---|---|
| WO | 2014110289 | 7/2014 |
| WO | 2017132594 | 8/2017 |

* cited by examiner

CONFIGURABLE MODAL AMPLIFIER SYSTEM

CROSS-REFERENCE TO RELATED APPLICATIONS

This patent application claims the benefit of priority from U.S. Provisional Patent Application No. 62/608,465, filed on 20 Dec. 2017; and European Patent Application No. 18156223.2, filed on 12 Feb. 2018, each one incorporated by reference in its entirety.

TECHNICAL FIELD

The present application relates to amplifiers. More specifically, embodiments of the present invention relate to modulation of the power supply rails for linear amplifiers.

BACKGROUND

Amplification of audio signals for the purpose of driving monitors or loudspeakers may be accomplished using a variety of amplifier topologies. Linear topologies, particularly class A topologies, are characterized by high fidelity (the high quality reproduction of the audio input signal). However, class A amplifiers can be inefficient, particularly at low signal levels. On the other hand, switching topologies, e.g., class D topologies, can achieve high levels of efficiency for a broad range of signal levels but are typically characterized by lower fidelity sound reproduction.

Attempts to improve the efficiency of some linear topologies (e.g., class A, B and class AB) involve manipulation of the rail voltages between discrete levels (class G) or continuously (class H) based on the input signal level.

DESCRIPTION OF EXAMPLE EMBODIMENTS

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

The present disclosure describes configurable amplifier systems in which the power supply rail(s) of a linear amplifier, e.g., a class A amplifier, is/are modulated by a switching amplifier(s), e.g., a class D amplifier that may also be configured to operate independently of the linear amplifier. A particular class of such amplifier systems are designed for the amplification of audio signals. Systems enabled by the present disclosure include configurable, multi-channel systems in which some channels may be configured to employ a switching amplifier to drive a load, e.g., a loudspeaker, while others may be configured to drive a load using a linear amplifier, the power supply rail(s) of which are modulated by one or more switching amplifiers. The present disclosure also describes various refinements by which the efficiencies with which various amplifiers operate may be enhanced.

Figure 1:
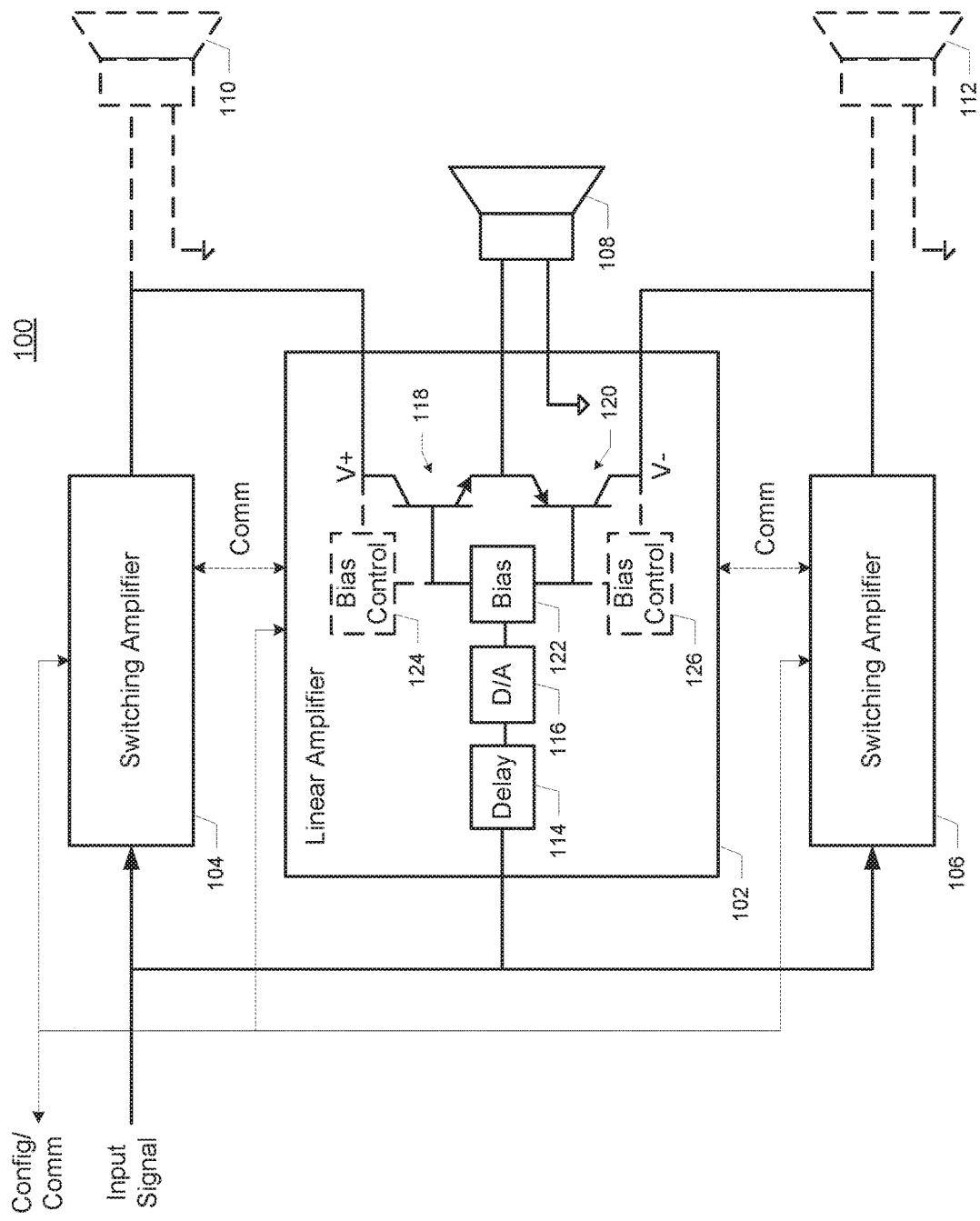
FIG. 1 is a block diagram of an amplifier system.

FIG. 1 is a block diagram of an example of a configurable amplifier system implemented according to a particular embodiment. Amplifier system 100 includes a linear amplifier 102 and switching amplifiers 104 and 106. Linear amplifier 102 (which may be, for example, a class A amplifier) is configured to amplify the input signal and drive a load (represented by loudspeaker 108). Switching amplifiers 104 and 106 are dual-mode amplifiers that may be configured (via the depicted config/comm link) in a first mode (referred to herein as rail modulation mode) to modulate positive power rail V+ and negative power rail V−, respectively, of linear amplifier 102. In a second mode (referred to herein as signal amplification mode), switching amplifiers 104 and 106 may each be configured to operate independently of linear amplifier 102. For example, each of the switching amplifiers might be configured for driving its own load as represented by loudspeakers 110 and 112 in dashed lines. In another example, the same load is driven in both modes, e.g. loudspeaker 108 is driven by the switching amplifier when it is in signal amplification mode and by the linear amplifier when the switching amplifier is in rail modulation mode.

In an example, when the switching amplifier operates in rail modulation mode, the input signal is amplified by the linear amplifier, wherein the power rails of the linear amplifier are modulated by the switching amplifier. In this example, when the switching amplifier operates in signal amplification mode, the input signal is amplified by the switching amplifier, and the linear amplifier is not used.

In rail modulation mode, switching amplifier 104 receives the same digital audio input signal received by linear amplifier 102 and generates positive rail V+ through positive peak rectification. Switching amplifier 106 generates negative rail V− based on the same input signal through negative peak rectification. Both enforce a nonzero DC bias at their outputs in this mode and may also have a minimum allowable voltage below which (in absolute value) the corresponding rail is not allowed to go. In this way, the supply rails for linear amplifier 102 track the input signal, providing sufficient supply voltages to handle large instantaneous signal levels with a low risk of clipping, while greatly reducing power consumption for low signal levels relative to designs with fixed rails.

Linear amplifier 102 includes (or is preceded by) delay circuitry 114 which delays the input signal before amplification by linear amplifier 102 to ensure proper synchronization with the modulation of the supply rails. The delay introduced by delay circuitry 114 ensures that the point in the input signal being amplified by the output stage of linear amplifier 102 (after conversion by digital-to-analog (D/A) converter 116) is sufficiently aligned with the corresponding point in the modulated rail voltages V+ and V−. The proper delay ensures desired efficiency gains due to the appropriate bias voltage levels being available while also reducing the likelihood of clipping events that might occur if the signals aren't properly aligned. A signal may be provided from linear amplifier 102 that indicates an amount of delay for synchronizing with other audio channels or accompanying video.

According to some implementations, the delay represented by delay circuitry 114 may be characterized at design time and so be fixed. Alternatively, the delay represented by delay circuitry 114 may be programmable. This might enable, for example, system designers and/or installers to test for and set the optimal delay for a given system configuration. For example, during the setup of an audio system, a tone might be used as input to the channel amps and the delay adjusted until the amplified tone is correct. Implementations are contemplated in which delay of the input signal to the linear amplifier is not necessary. In such cases, delay circuitry 114 may be configured or programmed to introduce delays that are greater than or equal to zero. Alternatively, delay circuitry 114 may have accompanying switching circuitry (not shown) that allows for delay circuitry 114 to be bypassed.

In addition, implementations are contemplated in which independently programmable delay circuitry is also provided with the switching amplifiers (not shown). This would provide additional flexibility in manipulating the relative delay between the two signal paths to ensure proper alignment between the rail voltages and the signal being amplified. In any of these cases, a signal may be provided from linear amplifier 102 and/or switching amplifiers 104 (e.g., via their respective config/comm links) that indicates the current delay(s) for synchronizing with other audio channels or accompanying video. As will be appreciated, delay circuitry may also need to be provided with such other audio channels and/or the accompanying video to support synchronization.

The attack and decay times that characterize the operation of switching amplifiers 104 and 106 in rail modulation mode may vary depending on the implementation. The attack time should be sufficiently fast in rail modulation mode to ensure proper alignment of the rail voltage and the amplified signal. On the other hand, it is desirable that the rail voltages move as slowly as practicable to avoid an unacceptable level of switching artifacts in the output of the linear amplifier.

There is more flexibility on the decay times which can be slower but at the expense of efficiency. That is, if the signal level drops faster than the rail voltage can follow, the rail voltage (and therefore the power dissipated) will be higher than is needed until the rail voltage catches up. Each system can be designed to achieve a desired balance between efficiency and fidelity. In addition, some implementations may make these parameters programmable by the system installer or end user.

In the example depicted in FIG. 1, linear amplifier 102 is a class A amplifier, the output stage of which is implemented with output transistors 118 and 120 in a push-pull configuration between positive and negative power supply rails. However, it should be noted that implementations are contemplated that employ other linear amplifier types and configurations. For example, linear amplifier 102 might be implemented as a class A, B, or AB amplifier. In another example, the output stage might be a single-ended configuration rather than push-pull. In yet another example, the output stage might be powered with one power supply rail (positive or negative) referenced to ground with an AC-coupled output. The scope of this disclosure should therefore not be limited to the particular amplifier configuration depicted.

In the example depicted in FIG. 1, the modulation scheme employed by switching amplifiers 104 and 106 results in rail voltages that track the input signal in a continuous manner similar to, for example, class H amplifier topologies. Examples of class H topologies are described in U.S. Pat. Nos. 6,373,335, 6,166,605, 4,445,095, and 4,218,660, the entire disclosure of each of which is incorporated herein by reference for all purposes. However, it should be noted that implementations are contemplated in which other modulation schemes are employed. For example, the switching amplifiers might drive the power supply rails of the linear amplifier to a number of discrete voltage levels using some form of stepped or quantized voltage rails. These discrete levels may be coarsely quantized as with, for example, class G topologies, an early example of which is the Dynaharmony HMA 8300 high-power audio amplifier by Hitachi (1977). Alternatively, the discrete levels may be more finely quantized. The scope of this disclosure should therefore not be limited to a particular rail modulation scheme.

As mentioned above, linear amplifier 102 may be a class A amplifier, in which case bias circuitry 122 is configured such that that both output transistors conduct 100% of the time. In some implementations, the standing or bias current of the output stage is fixed by bias circuitry 122 at about half of the expected peak current. Alternatively, and according to a particular class of implementations, the standing current of the output stage set by bias circuitry 122 may also be modulated in response to the input signal as represented by bias control blocks 124 and 126 which receive the modulated rail voltages V+ and V− as inputs, respectively. This allows for an additional increase in power efficiency on top of that provided by modulation of the power supply rails. An example of an implementation of such bias control circuitry is described with reference to FIGS. 4 and 5.

Figure 2:
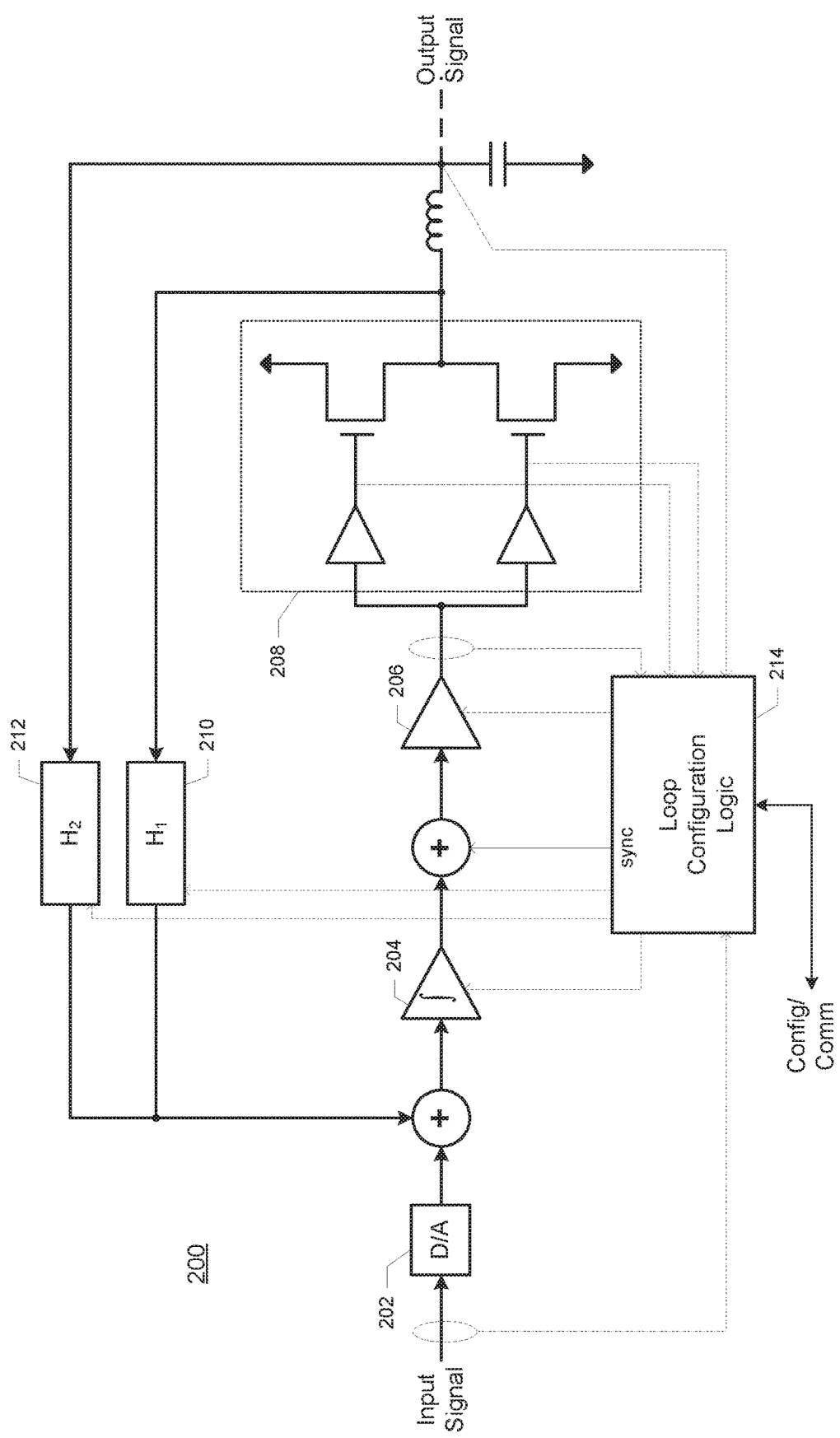
FIG. 2 is a diagram of a switching amplifier.

FIG. 2 is a block diagram of an example of a dual-mode switching amplifier 200 that may be employed with some embodiments. The depicted amplifier topology has features in common with some conventional class D amplifiers. The digital input signal (e.g., an N-bit audio stream) is converted to the analog domain by digital-to-analog (D/A) converter 202, the output of which is integrated by integrator 204. A synchronization (sync) signal is injected into the output of integrator 204 for comparison by comparator 206. The output of comparator 206 drives output stage 208 which drives a load (not shown) via an output LC filter. Feedback is provided via one or more feedback elements depicted in this example as feedback elements 210 and 212 having respective transfer functions $H_1$ and $H_2$.

Amplifier 200 also includes loop configuration logic 214 that is configured to set or control various loop parameters and aspects of the operation of amplifier 200. Logic 214 may be programmable and may be implemented with any of a variety of programmable logic devices (e.g., a field programmable gate array or FPGA), firmware controlled devices, discrete circuitry, and software. Logic 214 monitors various aspects of loop operation (as represented by dashed input lines) that may include, for example, the digital input signal, the one-bit output of comparator 206, the gate drives of the power transistors of output stage 208, the output signal after the LC filter, load characteristics, etc. Logic 214 uses these inputs to control various aspects of loop operation (as represented by dashed output lines) including, for example, synchronization control (via sync signal), duty cycle monitoring and level control, dead-band timing, dynamic loop delay control (e.g., using programmable delay lines (not shown)), controlling the transfer characteristic of integrator 204, manipulation of the transfer functions of feedback elements 210 and 212, etc.

Logic 214 may be configurable (e.g., via config/comm link) to cause amplifier 200 to operate differently in distinct modes of operation such as for example, the rail modulation and signal amplification modes described herein. The way in which logic 214 uses its various inputs to control the various aspects of loop operation can be optimized for the desired efficiency and fidelity associated with each mode. For example, at least some of the stringent requirements associated with the high fidelity amplification of an audio signal in signal amplification mode can be relaxed in rail modulation mode to achieve further gains in efficiency beyond the gains realized by rail modulation.

For example, class D amplifiers are characterized by switching losses which correlate with switching frequency. Fidelity also correlates with switching frequency meaning that there is a tradeoff between efficiency and fidelity. For rail modulation mode, logic 214 might optimize the switching characteristics of switching amplifier 200 for maximum power conversion rather than high fidelity. This might include implementation of so-called "soft switching;" the selection of the optimal times to switch the power transistors of the output stage to minimize their switching losses. That is, in the rail modulation mode, the power transistors could be switched such that they are transitioned at or near "ideal" moments in terms of the instantaneous voltage and current across each transistor as determined by monitoring of the LC output filter. Other examples of loop operation parameters that may be optimized via logic 214 for a given operational mode include switching frequency (a lower frequency improves efficiency), attack time, decay time, and soft switching (e.g., Zero Voltage Switching (ZVS) and Zero Current Switching (ZCS)), etc.

In another example, logic 214 could enforce a nonzero DC bias on the modulator output in rail modulation mode, e.g., by appropriate signal processing within the switching amplifier signal chain such as, for example, enforcing a minimum duty cycle that yields a net DC output potential, or injecting a DC offset into the front-end of the closed-loop servo.

For example, the switching amplifier may be configured to have a lower switching frequency in rail modulation mode than in signal amplification mode. In another example, the switching amplifier alternatively or additionally may be configured to have a shorter decay time in rail modulation mode than in signal amplification mode. In another example, the switching amplifier alternatively or additionally may be configured to apply soft switching of its output stage in a rail modulation mode, but not in signal amplification mode. In another example, the switching amplifier alternatively or additionally may be configured to enforce a nonzero DC bias at its output stage in rail modulation mode, but not in signal amplification mode.

Implementations enabled by the present disclosure include systems in which only a single channel of amplification is provided as well as systems in which multiple channels are provided and in which at least some level of synchronization among the channels is maintained. Examples of such multi-channel systems include home and professional cinema systems.

Techniques for creating content for cinema involve mixing digital audio signals to generate a digital audio soundtrack for presentation in combination with the visual component(s) of the overall cinematic presentation. Portions of the mixed audio signals are assigned to and played back over a specific number of predefined channels, e.g., 6 in the case of Dolby Digital 5.1, 8 in the case of Dolby Surround 7.1, and as many as 64 in the case of Dolby Atmos, all industry standards.

Figure 3:
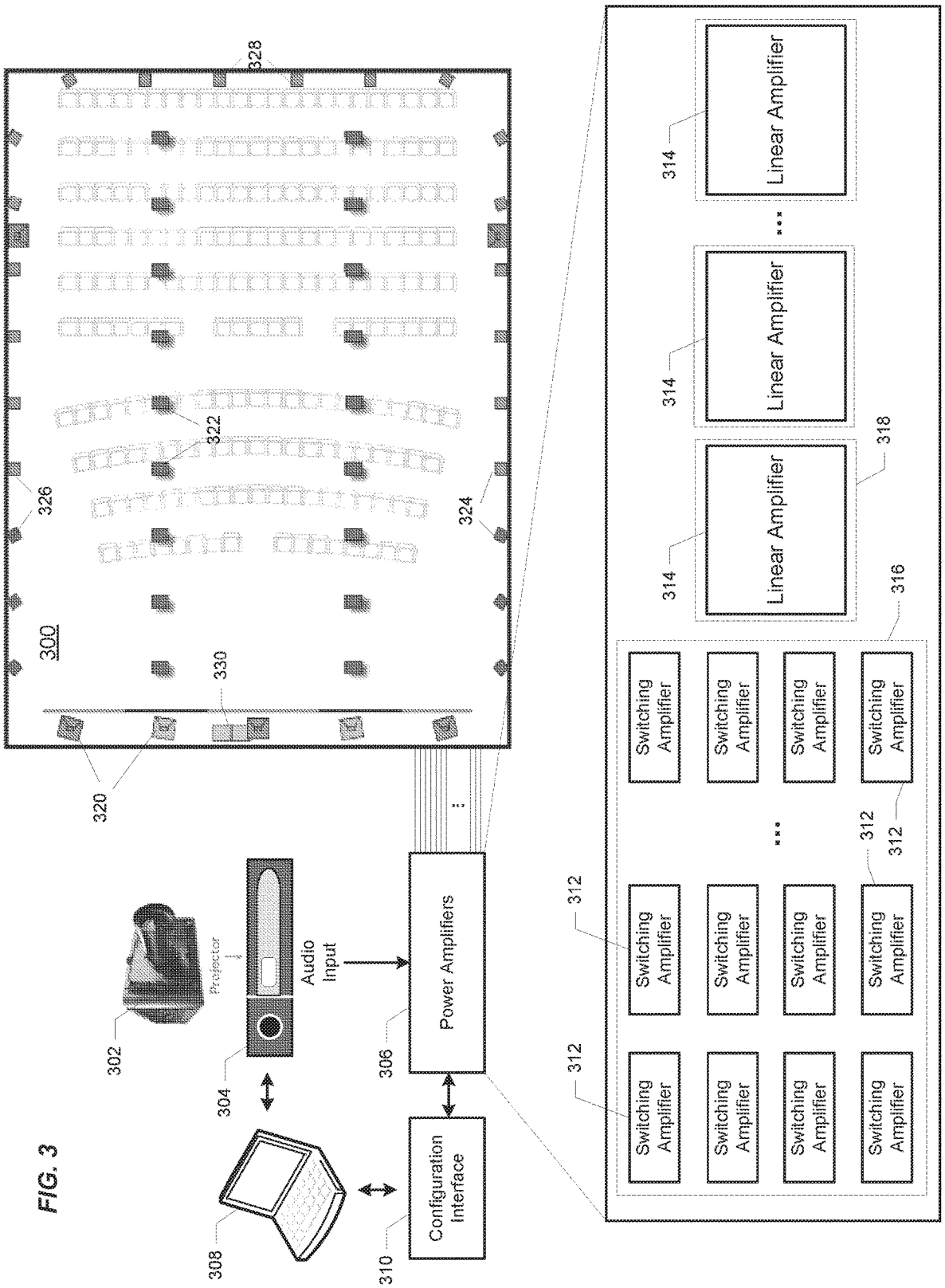
FIG. 3 is a block diagram of a multi-channel amplifier system.

FIG. 3 shows an example of a cinema environment 300 (viewed from overhead) in which a particular implementation may be practiced. A projector 302, a sound processor 304, and a bank of audio power amplifiers 306 operate cooperatively to provide the visual and audio components of the cinematic presentation, with power amplifiers 306 driving speakers and sub-woofers deployed around the environment (connections not shown for clarity). Sound processor 304 may be any of a variety of computing devices or sound processors including, for example, one or more personal computers or one or more servers, or one or more cinema processors such as, for example, the Dolby Atmos Cinema Processor CP850 from Dolby Laboratories, Inc. Interaction with sound processor 304 by a sound engineer might be done through a laptop 308, a tablet, a smart phone, etc., via, for example, a browser-based html connection. Audio measurements and sound processing will typically be done with the sound processor which includes analog or digital inputs to receive microphone feeds, as well as outputs to the power amplifiers that drive the speakers.

The depicted environment can be configured via sound processor 304 and amplifier configuration interface 310 to playback soundtracks having different numbers of audio channels (e.g., 6, 8, 10, 14, etc.), with different subsets of the amplifiers and the speakers corresponding to the different channels. Configuration interface 310 (with input, for example, from laptop 308) and appropriate interconnect cabling (not shown for clarity) may configure a subset of power amplifiers 306 to drive each subset or array of speakers with the audio for the corresponding channel in accordance with any of a variety of digital audio formats (e.g., Dolby 5.1, 7.1, or Atmos).

Power amplifiers 306 include switching amplifiers 312 and linear amplifiers 314. Switching amplifiers 312 might be implemented in individual chassis and enclosures (e.g., for mounting in racks), or included in a single chassis and enclosure (as represented by dashed box 316). Each of linear amplifiers 314 may have its own chassis and enclosure (as represented by dashed box 318). Such configurations may allow, for example, existing amplifier products to be repurposed to provide rail modulation to an external linear amplifier. In another alternative, each of linear amplifiers 314 may be integrated with a corresponding one of the loudspeakers in cinema environment 300 which are represented by the shaded blocks distributed throughout the environment. As yet another alternative, each of linear amplifiers 314 may be integrated with one or more of switching amplifiers 312. Other suitable variations on this theme will be apparent to those of skill in the art.

With appropriate interconnect cabling and configuration via interface 310, one or more of switching amplifiers 312 may be configured to modulate the supply rail(s) of one of linear amplifiers 314, that can itself be configured to drive one of the speakers in cinema environment 300 such as, for example, one of screen monitors 320. As these monitors tend to dominate the sound experience in such an environment, the selection of a linear amplifier might be warranted for higher-fidelity sound reproduction at the expense of power efficiency.

Such a configuration might include one of the switching amplifiers (operating in rail modulation mode) modulating the positive power supply rail of the linear amplifier and another switching amplifier (also operating in rail modulation mode) modulating the negative rail as described, for example, with reference to FIG. 1. The configuration of each of the switching amplifiers to operate in an optimized rail modulation mode may be accomplished, for example, as described with reference to FIG. 2 via configuration interface 310 and the config/comm link associated with each amplifier.

In contrast with the screen monitor channels, surround channels, e.g., as represented by overhead (322), left (324), right (326), and rear (328) monitors, or subwoofers (330) might warrant a different balance between power efficiency and fidelity, resulting in the use of switching amplifiers 312 to directly drive corresponding monitors. The configuration of each of switching amplifiers 312 to operate in an optimized signal amplification mode may be accomplished as described, for example, with reference to FIG. 2 via configuration interface 310 and the config/comm link associated with each amplifier. As will be appreciated, implementations in which the operation of each switching amplifier can be optimized for each of its different modes of operation provides considerable flexibility in configuring a multi-channel amplifier system such as that depicted in FIG. 3.

According to various implementations, the system depicted in FIG. 3 may be configured such that one or multiple speakers correspond to a particular audio channel. Moreover, amplifiers 306 may be combined (via appropriate interconnect cabling and configuration interface 310) in various ways to support a particular audio channel. For example, when operating in signal amplification mode, switching amplifiers 312 may each be configured to amplify the audio signal for a corresponding channel. Alternatively, switching amplifiers 312 may be configured to operate in parallel, half-bridge, or full-bridge configurations for a given audio channel. Similarly, linear amplifiers 314 (with power supply rail(s) modulated by one or more of switching amplifiers 312) may be configured to operate in parallel, half-bridge, or full-bridge configurations for a given audio channel. In addition, switching amplifiers 312 may be configured to operate in parallel, half-bridge, or full-bridge configurations in rail modulation mode to modulate one of the rails of one of linear amplifiers 314. Such configurations may provide, for example, for greater power handling flexibility or high efficiency operation.

Various implementations enabled by the present disclosure allow designers and/or system installers to strike the appropriate balance between amplifier distortion and power efficiency for particular applications. In the case of audio amplification, the use of a linear output stage strikes that balance in favor of higher-fidelity sound reproduction. However, despite the fidelity of even the best linear amplifiers, other factors in the system can still be the source of undesirable artifacts. For example, the transducers in the monitors driven by the audio amplifiers are mechanical systems constructed with paper, rubber, plastics, kapton, aluminum, and a variety of other materials, each having its own resonance and potential to produce undesirable artifacts. Moreover, the production of such artifacts is typically more pronounced at higher power levels.

According to a particular implementation, a linear amplifier (e.g., amplifier 102 of FIG. 1 or 314 of FIG. 3) may have associated feedback terminals for receiving transducer feedback so that undesirable artifacts from such transducers can be reduced as part of the linearization of the overall system loop in which the amplifier and speaker are included. As will be appreciated by those of skill in the art, there are a variety of ways in which such transducer feedback may be introduced. For example, according to some implementations, the feedback may be introduced using a nested loop that is local to the output stage. Such transducer feedback could be acquired via any of a variety of mechanical, electrical, acoustic, or other mechanisms. Examples include a separate winding adjacent the voice coil, capacitive or other transducers to track the motion of the speaker cone, pressure sensors on the baffle adjacent the cone, etc.

Implementations in which the switching amplifiers and the linear amplifiers are integrated with different chassis present opportunities for placing the linear amplifier in close proximity to the speaker it is driving. That is, if the linear amp enclosure is separate from the switching amplifier(s) modulating its power supply rail(s), the linear amp enclosure can be placed closer, and even immediately adjacent, the speaker it is driving. Thus, its transducer feedback terminal(s) on the exterior of its enclosure may be connected through very short cable(s) to the transducer feedback mechanism(s) associated with the speaker. This may be advantageous in applications such as the cinema environment of FIG. 3 in that there might be dozens, if not hundreds, of feet of cable between the equipment racks and some speakers. Close proximity means a shorter loop to linearize and therefore better performance. It is also unlikely that the speakers will include active electronics to power any transducer feedback sensors or to transmit the transducer feedback over any significant distance.

According to some implementations, the linear amplifier can be implemented in the same enclosure with the speaker; that is, a powered speaker in which the power is being supplied by external switching amplifiers. This would eliminate the need to bring the transducer feedback of the speaker and the transducer feedback terminals of the linear amplifier outside the enclosure, allowing a wider variety of methods to employ feedback, and potentially improving the linearization of the transducer artifacts.

Figure 4:
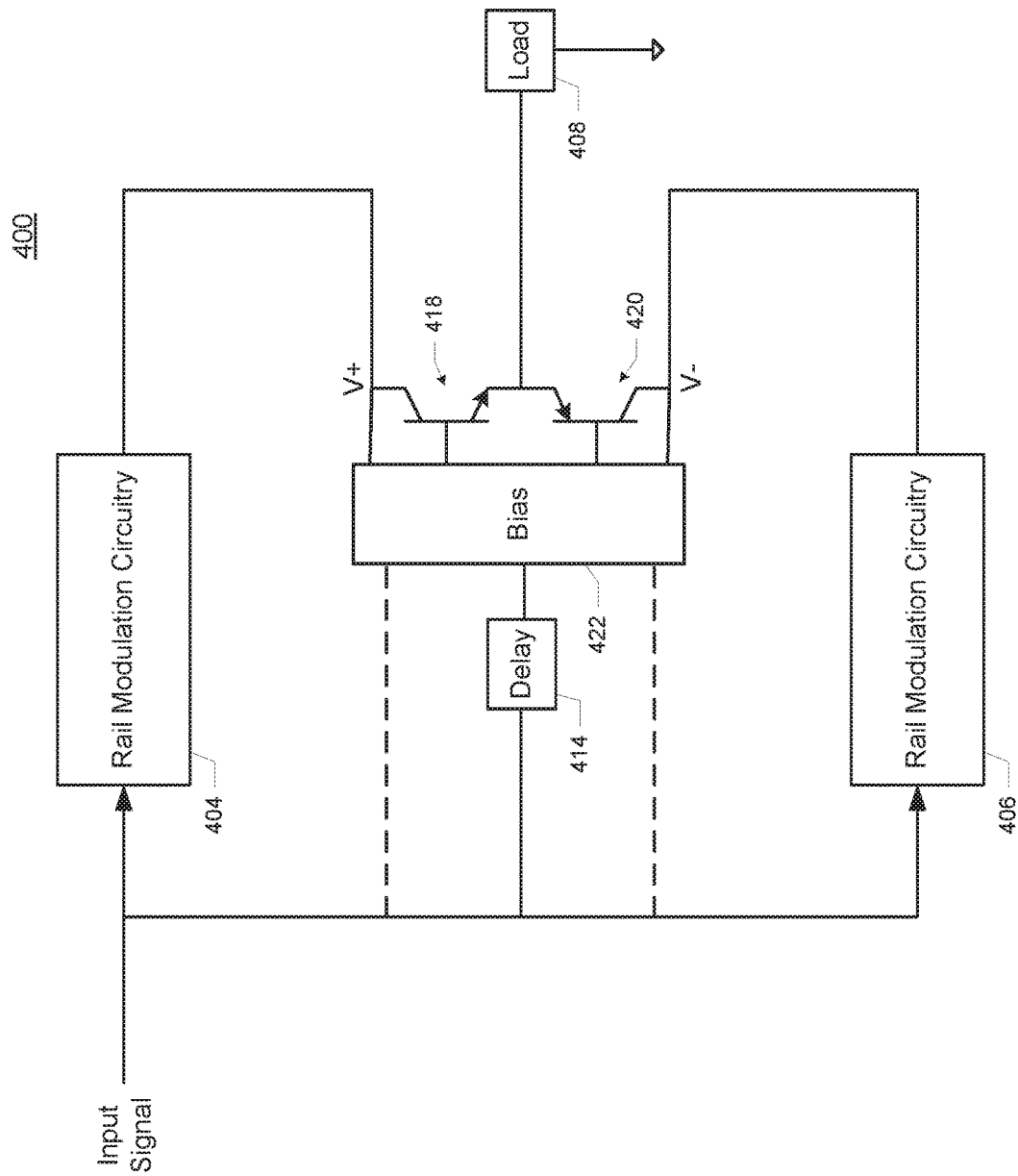
FIG. 4 is a block diagram of an amplifier system.

FIG. 4 illustrates an example of an implementation of an amplifier 400 in which both the supply rail voltages and the bias current of the output stage are modulated. As described above, modulating the rail voltages results in supply voltages that are just large enough to support the swing of the amplified signal. Modulation of the standing current of the output stage further reduces power dissipation.

In the example depicted in FIG. 4, the output stage of amplifier 400 is implemented with output transistors 418 and 420 in a push-pull configuration between positive and negative power supply rails V+ and V− and is configured for class A operation in the driving of load 408. However, it should be noted that implementations are contemplated that employ other configurations and biasing schemes. For example, the output stage of amplifier 400 might be configured for class A, B, or AB operation. In another example, the output stage might be a single-ended configuration rather than push-pull. In yet another example, the output stage might be powered with one power supply rail (positive or negative) referenced to ground. The scope of this disclosure should therefore not be limited to the particular amplifier configuration depicted.

Amplifier 400 includes rail modulation circuitry 404 and 406 that may be configured to modulate their respective power supply rails according to any of a variety of modulation schemes. For example, a suitable rail modulation scheme might result in rail voltages that track the input signal in a continuous manner similar to, for example, class H amplifier topologies. In another example, the rail modulation circuitry might drive the power supply rails of the linear output stage to a number of discrete voltage levels using some form of quantization circuitry. These discrete levels, or stepped rails, may be coarsely quantized as with, for example, class G topologies, or more finely quantized. The scope of this disclosure should therefore not be limited to a particular rail modulation scheme.

According to a particular subset of implementations, rail modulation circuitry 404 and 406 may be implemented with switching amplifiers, e.g., class D amplifiers. These amplifiers might be configurable as described elsewhere herein, but might also be purpose-built for rail modulation. Alternatively, rail modulation circuitry may be any of a wide variety of conventional circuits used to modulate the rails of a linear amplifier. Amplifier 400 may include (or be preceded by) delay circuitry 414 which delays the input signal before amplification by the linear output stage to ensure proper synchronization with the modulation of the supply rails.

According to a particular subset of implementations, the output stage bias current includes a static component and a dynamic component. The static component is set based on the minimum load amplifier 400 is expected to drive. For example, if amplifier 400 is an audio amplifier, it might be expected to drive loudspeaker loads of 2 to 8 ohms. If it is known that amplifier 400 will not see a load that is lower than 8 ohms, the static component of the bias current can be set to support a maximum bias current based on 8 ohms rather than a much higher maximum that would be required to drive 2 ohms. The dynamic component of the output stage bias current may be based on the modulated power supply rails, modulating the standing current around the level corresponding to the static component. Alternatively, the dynamic component of the output stage bias current may be based on a feed forward signal that corresponds to or is based on the input signal (as indicated by the dashed lines). In addition, both the static and dynamic components of the control of the output stage bias current may be configurable such that one or both may be turned on or off at set up time.

Figure 5A:
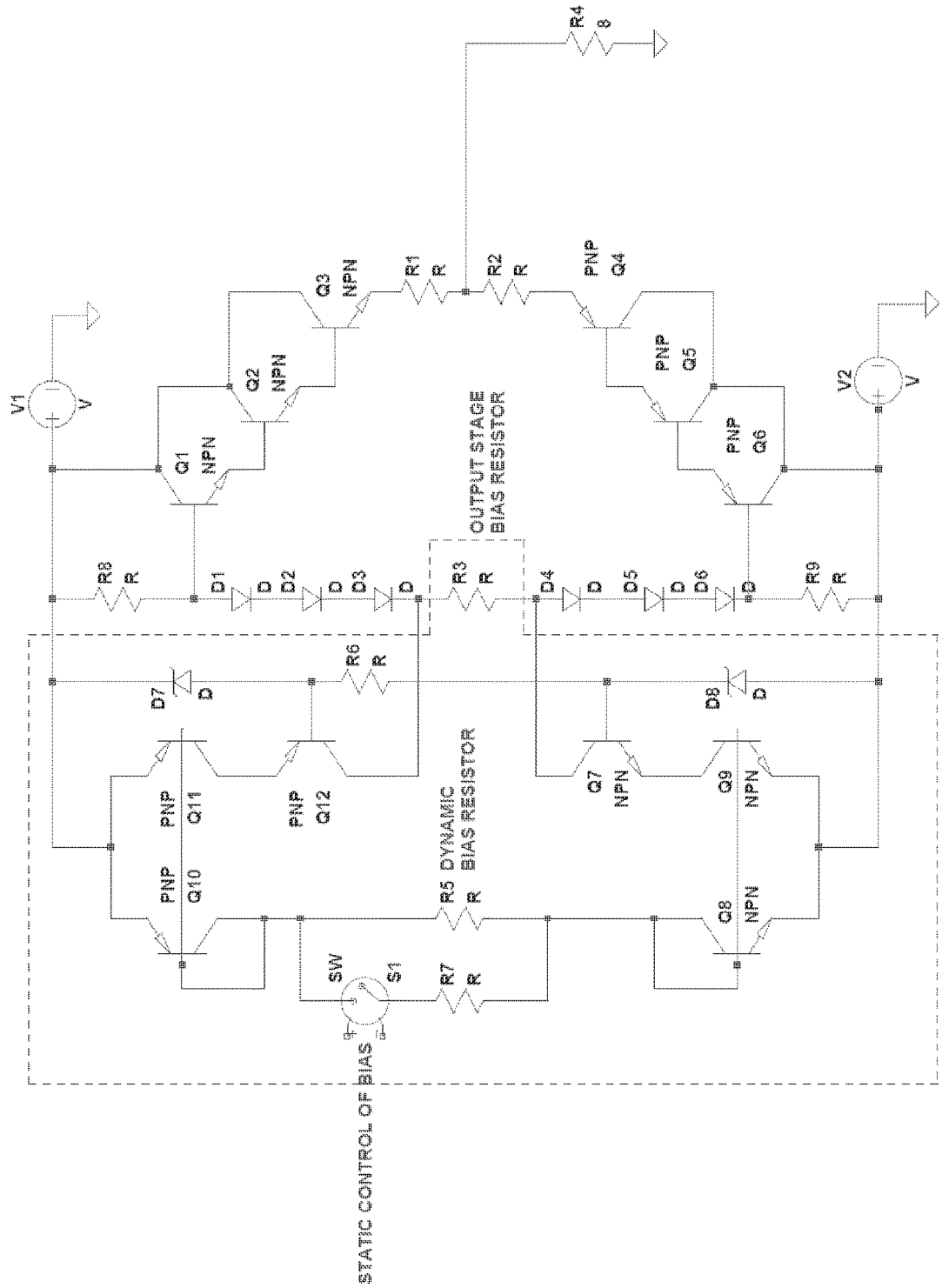
FIG. 5A is a schematic of bias control circuitry.

A particular implementation of bias circuitry 422 is shown in FIG. 5A. In the depicted implementation, R4 represents the speaker load (8 ohms in this example), and Q1, Q2, and Q3 form a triple Darlington (e.g., in place of output transistor 418 of FIG. 4) of which Q3 is the output device that sources current to the load on positive cycles. Q4, Q5, and Q6 form another triple Darlington (e.g., in place of output transistor 420 of FIG. 4) of which Q4 is the output device that sinks current from the load on negative cycles. V1 and V2 are the positive and negative power supply rails for the output stage which may be, for example, modulated rails from a class D stage in modulator mode as described above (e.g., V+ and V− of FIG. 4) R1 and R2, in conjunction with the bias-setting network, determine the bias current in the output stage. The voltage across R3 modulates the voltage across resistors R1 and R2. This, in turn, modulates the bias current in the output stage. Diodes D1-D6 are intended to cancel out the $V_{BE}$ voltage drops of output devices Q1-Q6.

The active components in the dashed-line box include current sources that allow R3 to float with respect to circuit ground. As the positive and negative rails of the output stage are modulated, the current through the branch formed by Q8, Q10, and R5 determines the current that is reflected through the current mirrors (to Q7, Q9 and Q11, Q12). This, in turn, is converted into a voltage across R3. Because R3 is in parallel with R1 and R2, the same voltage modulates the output stage bias current. It should be noted that the circuit depicted in FIG. 5A may be designed to operate in class A, class B, or class A/B.

Static control of the bias current is set by R5 in shunt with R7 when switch S1 is closed. Multiple switches and resistors may be used if multiple loads impedances are to be supported (e.g., 2, 4, 8 ohms, etc.). Knowing maximum output power of the amplifier and the load impedance connected to it, the output bias could be selected to avoid wasting excess energy. Dynamic control of the bias current is set by the gain through the current mirrors which is a factor of R5 (and R7) as well as the design of the current sources.

Figure 5B:
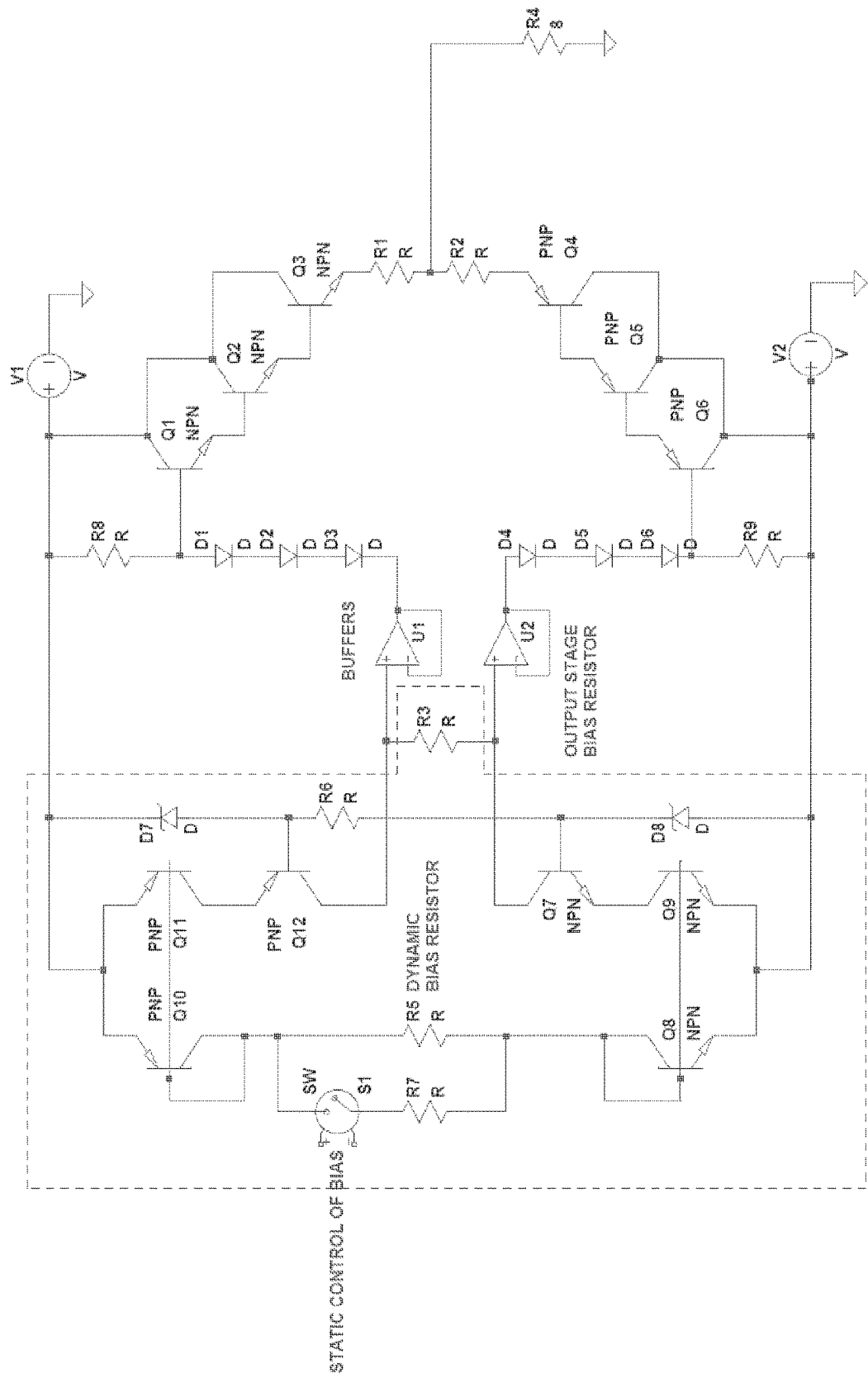
FIG. 5B is another schematic of bias control circuitry.

FIG. 5B shows a modified version of the circuit of FIG. 5A in which (optional) operational amplifiers U1 and U2 are used as buffers to ensure that the output stage doesn't load the modulated bias voltage. These may not be necessary for some implementations. In some implementations, U1 and U2 might be replaced with simpler circuits such as, for example, emitter followers.

Figure 6:
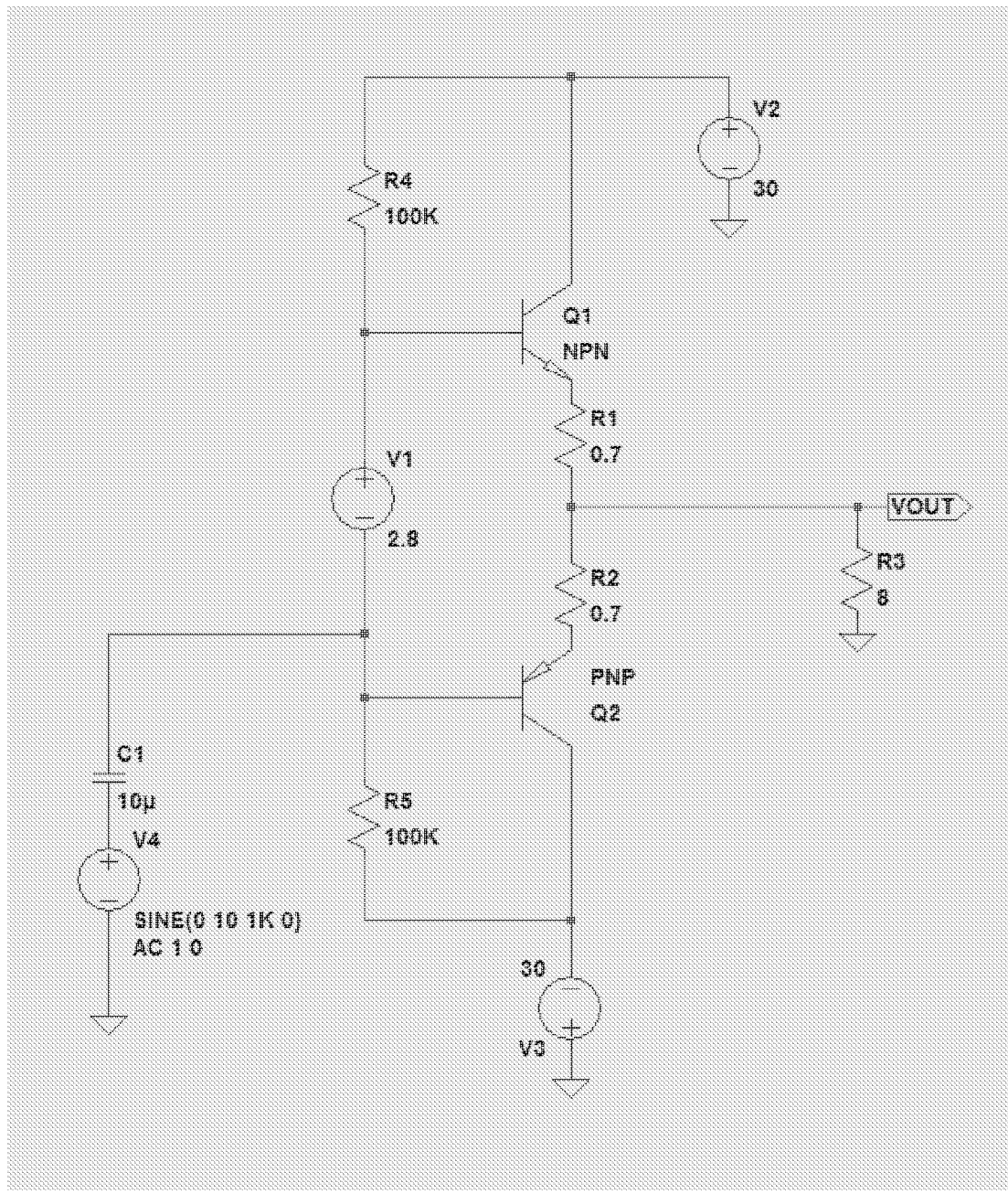
FIG. 6 is a simplified schematic of an amplifier output stage for demonstration of amplifier efficiency calculations.

FIG. 6 is a circuit diagram that is the basis for amplifier output stage efficiency calculations described below. V2 and V3 are positive and negative voltage rails, respectively, and are generally equal in magnitude but opposite in sign. Q1 and Q2 are output stage devices for conveying power from the power supply (V2, V3) to the load R3 (also to be referred to as RL). In the following examples: V2=−V3=30V; and RL=8 Ohms. The combination of V1, R1, and R2 determine the bias current for the output stage. V1 determines the class of operation of the output stage. V4 is the AC input signal source. For the following calculations, efficiency is determined by the ratio of the RMS power consumed by the load to the average power delivered by the power supply (which includes both rails for a bipolar design).

Definition of efficiency:

$$\eta = \frac{P_L}{P_S}$$

The calculations below are for traditional static (non-modulated) rail cases (class A and class B) using push-pull output stages as shown in FIG. 6 for sine waves. These calculations provide the basis for the modulated rail case, and will show that the maximum efficiency that can be achieved with static rails only at maximum output voltages, will be the case for all signal levels for the modulated case.

Class A push-pull efficiency calculations for $V_{OUT}$=VCC
Power Supply Voltage Rails $$V_{CC}=30V$$

$$V_{CC}=-V_{EE}$$

Peak Output Voltage to Load $$V_{o\_pk}=V_{CC}$$

(Set equal to the rail voltage for max efficiency)
Load Impedance $$R_L=8\Omega$$

Average Current Drawn from Supply $$I_{CC} = \frac{V_{CC}}{R_L}$$

Power delivered by supply (the amended subscript, "A," denotes class A operation):

$$P_{SA}=V_{CC}\cdot I_{CC}=112.5 \text{ W}$$

RMS-to-peak ratio (inverse crest factor) for common signals: Triangle wave=1/√3; Sine wave=1/√2; Square wave=1 (e.g., see the Wikipedia entry for Crest Factor at https://en.wikipedia.org/wiki/Crest_factor, and Root mean square at https://en.wikipedia.org/wiki/Root_mean_square).

$$k = \begin{pmatrix} \sqrt{3} \\ \sqrt{2} \\ 1 \end{pmatrix}$$

RMS power delivered to load (the amended subscript, "A," denotes class A operation):

$$P_{LA} = \frac{(V_{o\_pk}/k)^2}{R_L} = \begin{pmatrix} 37.5 \\ 56.25 \\ 112.5 \end{pmatrix} W$$

Maximum Class A Efficiency $$\eta_A = \frac{P_{LA}}{P_{SA}} = \begin{pmatrix} 33.3 \\ 50 \\ 100 \end{pmatrix} \%$$

Figure 7:
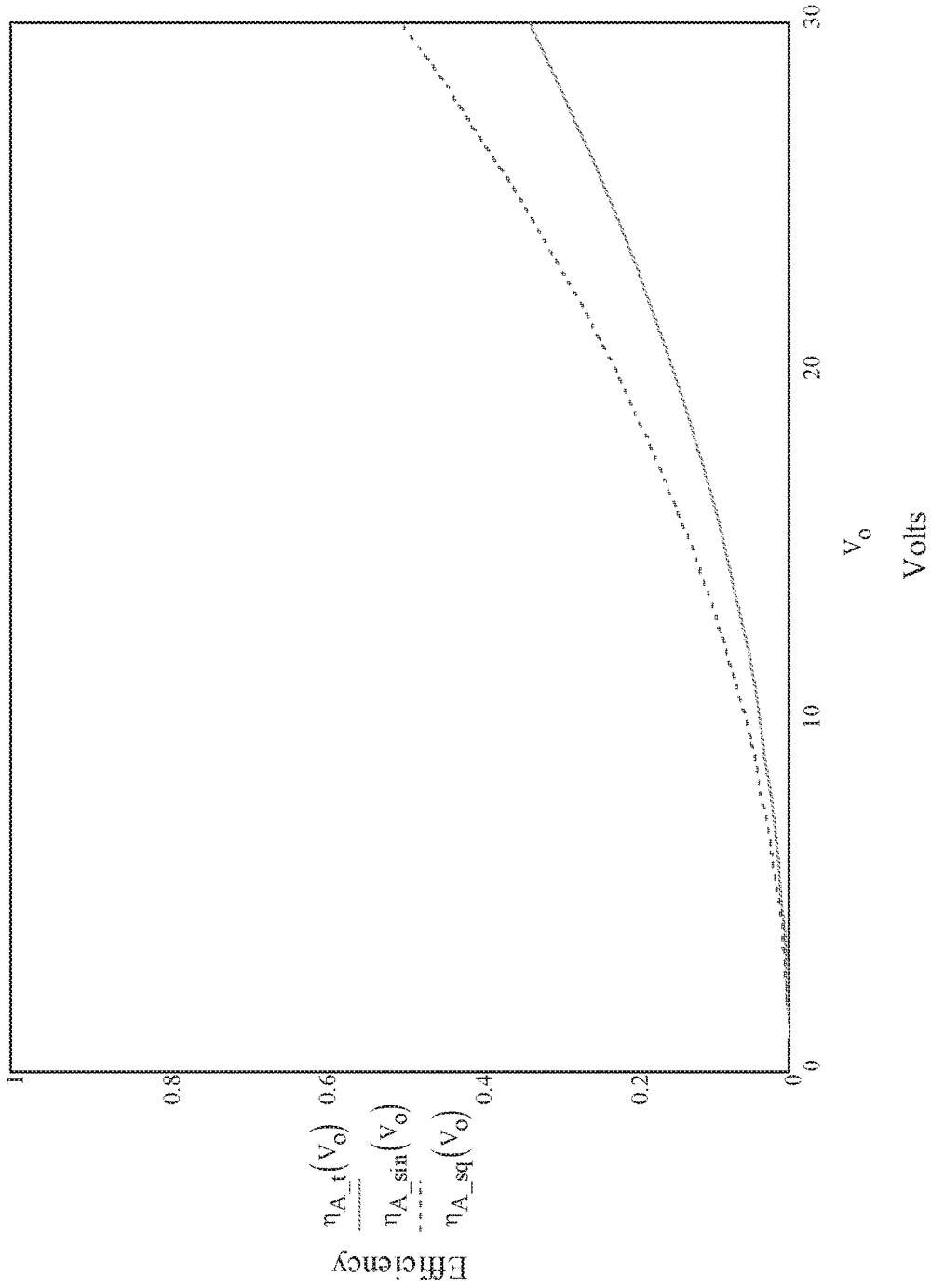
FIG. 7 is a plot of amplifier efficiency vs. output signal level for a class A amplifier.

Note that the efficiency improves as the RMS-to-peak ratio increases. FIG. 7 is a plot showing Class A output stage efficiency as a function of output level for triangle, sine, and square waves.

Class B push-pull efficiency calculations for $V_{OUT}$=VCC (assume the following variables are the same as the Class A example calculation from above).

Power Supply Voltage Rails $V_{CC}$=30V $V_{CC}$=−$V_{EE}$

Peak Output Voltage to Load $V_{o\_pk}$=$V_{CC}$ (Set equal to the rail voltage for max efficiency)
Load Impedance $R_L$=8Ω

Case when Vout,pk=Vcc: Average-to-Peak ratios for common signals: Triangle wave=0.5; Sine wave=2/π; Square wave=1

$$k_{AVE} = \begin{pmatrix} 0.5 \\ 2/\pi \\ 1 \end{pmatrix}$$

Average Current Drawn from Supply $$I_{CC\_B} = k_{AVE} \cdot \frac{V_{o_{pk}}}{R_L}$$

Power delivered by supply (the amended subscript, "B," denotes class B operation):

$$P_{SB} = V_{CC} \cdot I_{CC_B} = \begin{pmatrix} 56.25 \\ 71.62 \\ 112.5 \end{pmatrix} W$$

RMS power delivered to load (the amended subscript, "B," denotes class B operation)

$$P_{LB} = \frac{(V_{o\_pk}/k)^2}{R_L} = \begin{pmatrix} 37.5 \\ 56.25 \\ 112.5 \end{pmatrix} W$$

Maximum Class B Efficiency $$\eta_B = \frac{P_{LB}}{P_{SB}} = \begin{pmatrix} 66.67 \\ 78.54 \\ 100 \end{pmatrix} \%$$

Figure 8:
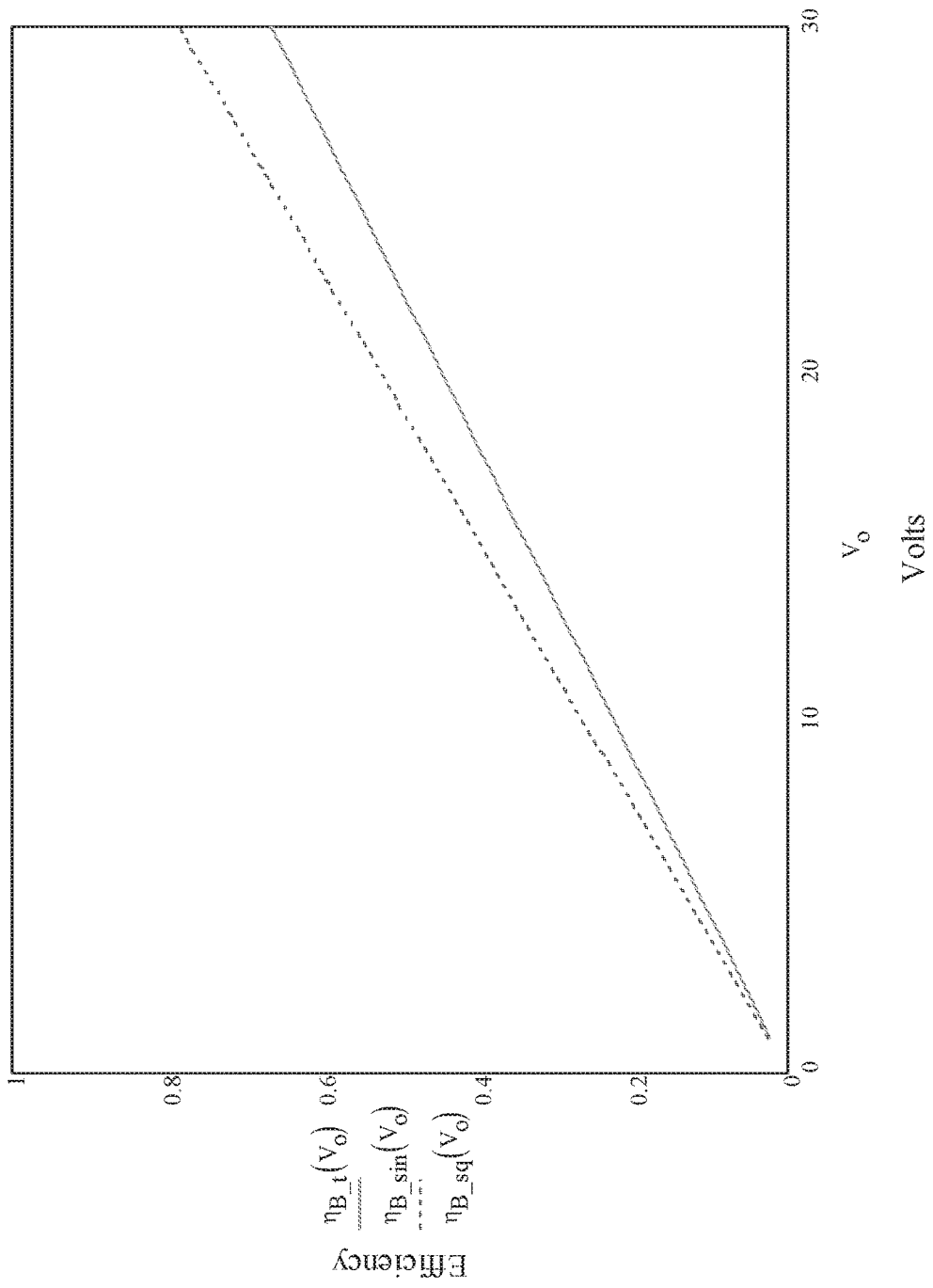
FIG. 8 is a plot of amplifier efficiency vs. output signal level for a class B amplifier.

Again note that the efficiency improves as the RMS-to-peak and average-to-peak ratios increase. FIG. 8 is a plot showing Class B output stage efficiency as a function of output level for triangle, sine, and square waves.

With regard to power supply current during Class A operation, current drawn from the power supply is constant, and is determined by the biasing network which is designed with the intended worst-case load in mind. The output devices steer current demanded by the load according to the input signal. However, the power supply sees a constant current. In Class B operation, the power supply sees primarily the load current which flows through the power supply filter capacitors.

The above analyses of the static voltage rail cases for class A and B output stages show two important things. First, efficiency is a function of output signal level and is maximum when the output level is equal to the rail voltage (Vcc, Vee). Second, efficiency is proportional to the RMS-to-peak ratio (inverse crest factor) of the signals being amplified (e.g., Sine wave=1/√2=0.707; Triangle wave=1/√3=0.577; Square wave=1; Pink Noise ~.4 (or higher depending on distribution).

In theory, the modulated rail case then strives to achieve the maximum efficiency case all the time as allowed by these linear push-pull topologies regardless of input signal level. Further losses then depend on the signal crest factors (e.g., see "k" factors shown in calculations above).

For example, to appreciate this improvement, if the input signal RMS level is 10% of the rail voltage 90% all of the time, then the overall efficiency is not much better than 10%. However if modulating the voltage rail, the peak level of the signal can be nearly equal to the rail 100% of the time. The resulting efficiency then will depend on the crest factor of the input signal. Since audio has typical crest factors of 3 dB or more, this means an efficiency of nearly 50% for all signal levels when biased for Class A operation.

Moreover, and as stated elsewhere herein, further efficiency improvements can be made by modifying the bias current in one or both of the following manners: (1) Making a static bias current adjustment based on known load impedance; and/or (2) Modulated bias current based on rail modulation. Depending on the precision of the bias current modulation and the lower limit allowed for the modulated voltage rails to keep the output devices turned on, even higher efficiencies may be attained.

Implementations disclosed herein include the following implementations:

Implementation 1 is an amplifier system that includes a linear amplifier. The linear amplifier has a power supply rail. The amplifier system further includes a first switching amplifier. The first switching amplifier is configurable in a first mode to modulate the power supply rail of the linear amplifier based on an input signal to the linear amplifier. The first switching amplifier is configurable in a second mode to operate independently of the linear amplifier.

Implementation 2 is the amplifier system of implementation 1, wherein the first switching amplifier is a class D amplifier.

Implementation 3 is the amplifier system of implementation 1 or 2, wherein the linear amplifier is a class A amplifier, a class B amplifier, or a class AB amplifier.

Implementation 4 is the amplifier system of any of implementations 1-3, wherein the first switching amplifier is configurable to operate in the first mode at a first average power efficiency and in the second mode at a second average power efficiency that is lower than the first average power efficiency.

Implementation 5 is the amplifier system of any of implementations 1-4, wherein the first switching amplifier is configurable to operate in the first mode at a first switching frequency and in the second mode at a second switching frequency that is higher than the first switching frequency.

Implementation 6 is the amplifier system of any of implementations 1-5, wherein the first switching amplifier is configurable to operate in the first mode at a first distortion level and in the second mode at a second distortion level that is lower than the first distortion level.

Implementation 7 is the amplifier system of any of implementations 1-6, wherein the first mode of the first switching amplifier is characterized by soft switching of an output stage of the first switching amplifier.

Implementation 8 is the amplifier system of any of implementations 1-7, wherein the first mode of the first switching amplifier is characterized by enforcement of a nonzero DC bias at an output of the first switching amplifier.

Implementation 9 is the amplifier system of any of implementations 1-8, further including first delay circuitry configured to delay the input signal before it is amplified by the linear amplifier.

Implementation 10 is the amplifier system of implementation 9, wherein the first delay circuitry is programmable to introduce a delay greater than or equal to zero, or wherein the first delay circuitry is configurable to be bypassed.

Implementation 11 is the amplifier system of implementation 9 or 10, further including second delay circuitry configured to delay the input signal before it is amplified by the first switching amplifier, wherein both the first delay circuitry and the second delay circuitry are independently programmable.

Implementation 12 is the amplifier system of any of implementations 1-11, further including a first chassis and a second chassis, the linear amplifier being integrated with the first chassis, and the first switching amplifier being integrated with the second chassis.

Implementation 13 is the amplifier system of implementation 12, further including one or more sense terminals integrated with the first chassis and configured to provide feedback to the linear amplifier from a load driven by the linear amplifier.

Implementation 14 is the amplifier system of implementation 12, wherein a load driven by the linear amplifier is integrated with the first chassis.

Implementation 15 is the amplifier system of any of implementations 1-14, further including bias modulation circuitry configured to modulate a standing current of the linear amplifier based on the input signal to the linear amplifier or based on modulation of the power supply rail.

Implementation 16 is the amplifier system of implementation 15, wherein the bias modulation circuitry is configurable to modulate the standing current of the linear amplifier based on a specified load impedance.

Implementation 17 is the amplifier system of any of implementations 1-16, wherein the power supply rail is a positive power supply rail and the linear amplifier also has a negative power supply rail, the amplifier system further including a second switching amplifier, the second switching amplifier being configurable in a first mode to modulate the negative power supply rail of the linear amplifier based on the input signal to the linear amplifier, the second switching amplifier being configurable in a second mode to operate independently of the linear amplifier.

Implementation 18 is the amplifier system of any of implementations 1-17, wherein the first switching amplifier is configured to modulate the power supply rail of the linear amplifier in a substantially continuous manner.

Implementation 19 is the amplifier system of any of implementations 1-17, wherein the first switching amplifier is configured to drive the power supply rail of the linear amplifier to a plurality of discrete voltages.

Implementation 20 is an amplifier system that includes a plurality of linear amplifiers. Each linear amplifier has one or more power supply rails. The amplifier system further includes a plurality of switching amplifiers. Each of the switching amplifiers is configurable in a first mode to modulate one of the power supply rails of a corresponding one of the linear amplifiers based on an input signal to the corresponding linear amplifier. Each of the switching amplifiers is configurable in a second mode to operate independently of the linear amplifiers and others of the switching amplifiers. A control interface is configured to enable configuration of the amplifier system into a plurality of channels. Each of a first subset of the channels includes one of the switching amplifiers configured to operate in the second mode. Each of a second subset of the channels includes one of the linear amplifiers and one or more of the switching amplifiers configured to operate in the first mode.

Implementation 21 is the amplifier system of implementation 20, wherein the linear amplifiers are class A amplifier, a class B amplifier, or a class AB amplifier, and the switching amplifiers are class D amplifiers.

Implementation 22 is the amplifier system of implementation 20 or 21, wherein each switching amplifier is configurable via the control interface to operate in the first mode at a first average power efficiency and a first distortion level and in the second mode at a second average power efficiency and a second distortion level, the first average power efficiency being higher than the second average power efficiency, and the first distortion level being higher than the second distortion level.

Implementation 23 is the amplifier system of any of implementations 20-22, wherein the first mode of each switching amplifier is characterized by soft switching of an output stage of the switching amplifier.

Implementation 24 is the amplifier system of any of implementations 20-23, wherein the first mode of each switching amplifier is characterized by enforcement of a nonzero DC bias at an output of the switching amplifier.

Implementation 25 is the amplifier system of any of implementations 20-24, further including delay circuitry associated with each of the linear amplifiers that is configured to delay the corresponding input signal.

Implementation 26 is the amplifier system of implementation 25, wherein the delay circuitry is programmable via the control interface to introduce a delay greater than or equal to zero, or wherein the delay circuitry is configurable via the control interface to be bypassed.

Implementation 27 is the amplifier system of any of implementations 20-26, further including a plurality of chassis, each linear amplifier being integrated with a corresponding one of the chassis, all of the switching amplifiers being integrated with one of the chassis.

Implementation 28 is the amplifier system of implementation 27, wherein each of the chassis integrated with a corresponding one of the linear amplifiers includes one or more sense terminals configured to provide feedback to the corresponding linear amplifier from a load driven by the linear amplifier.

Implementation 29 is the amplifier system of any of implementations 20-28, wherein the control interface is configured to enable configuration of two of the channels of the amplifier system to operate in parallel, in a half-bridge mode, or in a full-bridge mode.

Implementation 30 is the amplifier system of any of implementations 20-29, wherein the control interface is configured to enable configuration of two or more of the switching amplifiers to modulate one of the power supply rails of one of the linear amplifiers, the two or more of the switching amplifiers being in parallel, in a half-bridge configuration, or in a full-bridge configuration.

Implementation 31 is an amplifier system that includes a linear amplifier. The linear amplifier has a power supply rail. The amplifier system further includes first rail modulation circuitry configured to modulate the power supply rail of the linear amplifier based on an input signal to the linear amplifier. The amplifier system further includes bias modulation circuitry configured to modulate a standing current of the linear amplifier based on the input signal to the linear amplifier or based on modulation of the power supply rail.

Implementation 32 is the amplifier system of implementation 31, wherein the bias modulation circuitry is configurable to modulate the standing current of the linear amplifier based on a specified load impedance.

Implementation 33 is the amplifier system of implementation 31 or 32, wherein the first rail modulation circuitry is configured to modulate the power supply rail of the linear amplifier in a substantially continuous manner.

Implementation 34 is the amplifier system of implementation 31 or 32, wherein the first rail modulation circuitry is configured to drive the power supply rail of the linear amplifier to a plurality of discrete voltages.

Implementation 35 is the amplifier system of implementation 31-34, wherein the first rail modulation circuitry is a switching amplifier.

Implementation 36 is the amplifier system of implementation 35, wherein the linear amplifier is a class A amplifier, a class B amplifier, or a class AB amplifier, and the switching amplifier is a class D amplifier.

Implementation 37 is the amplifier system of implementation 35 or 36, wherein the switching amplifier is configurable in a first mode to modulate the power supply rail of the linear amplifier based on the input signal, and configurable in a second mode to operate independently of the linear amplifier.

Implementation 38 is the amplifier system of implementation 37, wherein the switching amplifier is configurable to operate in the first mode at a first average power efficiency and in the second mode at a second average power efficiency that is lower than the first average power efficiency.

Implementation 39 is the amplifier system of implementation 37 or 38, wherein the switching amplifier is configurable to operate in the first mode at a first switching frequency and in the second mode at a second switching frequency that is higher than the first switching frequency.

Implementation 40 is the amplifier system of any of implementations 37-39, wherein the switching amplifier is configurable to operate in the first mode at a first distortion level and in the second mode at a second distortion level that is lower than the first distortion level.

Implementation 41 is the amplifier system of any of implementations 37-40, wherein the first mode of the switching amplifier is characterized by soft switching of an output stage of the switching amplifier.

Implementation 42 is the amplifier system of any of implementations 37-41, wherein the first mode of the switching amplifier is characterized by enforcement of a positive DC bias at an output of the switching amplifier.

Implementation 43 is the amplifier system of any of implementations 31-42, further including first delay circuitry configured to delay the input signal before it is amplified by the linear amplifier.

Implementation 44 is the amplifier system of implementation 43, wherein the first delay circuitry is programmable to introduce a delay greater than or equal to zero, or wherein the first delay circuitry is configurable to be bypassed.

Implementation 45 is the amplifier system of implementation 43 or 44, further including second delay circuitry configured to delay the input signal before it used by the first rail modulation circuitry to modulate the power supply rail of the linear amplifier, wherein the first delay circuitry and the second delay circuitry are independently programmable.

Implementation 46 is the amplifier system of any of implementations 31-45, further including a first chassis and a second chassis, the linear amplifier being integrated with the first chassis, and the first rail modulation circuitry being integrated with the second chassis.

Implementation 47 is the amplifier system of implementation 46, further including one or more sense terminals integrated with the first chassis and configured to provide feedback to the linear amplifier from a load driven by the linear amplifier.

Implementation 48 is the amplifier system of implementation 46, wherein a load driven by the linear amplifier is integrated with the first chassis.

Implementation 49 is the amplifier system of any of implementations 31-48, wherein the power supply rail is a positive power supply rail and the linear amplifier also has a negative power supply rail, the amplifier system further including second rail modulation circuitry configured to modulate the negative power supply rail of the linear amplifier based on the input signal to the linear amplifier, and wherein the bias modulation circuitry is configured to modulate the standing current of the linear amplifier based on modulation of the positive power supply rail and the negative power supply rail.

Implementation 50 is an amplifier system that includes a first amplifier. The first amplifier is a linear amplifier having a power supply rail. The amplifiers system further includes a second amplifier. The second amplifier is configurable in a first mode to modulate the power supply rail of the first amplifier based on an input signal to the first amplifier. The second amplifier is configurable in a second mode to operate independently of the first amplifier.

Implementation 51 is the amplifier system of implementation 50, wherein the second amplifier is a switching amplifier.

Implementation 52 is the amplifier system of implementation 50 or 51, wherein the first amplifier is a class A amplifier, a class B amplifier, or a class AB amplifier.

Implementation 53 is the amplifier system of any of implementations 50-52, wherein the second amplifier is configurable to operate in the first mode at a first average power efficiency and in the second mode at a second average power efficiency that is lower than the first average power efficiency.

Implementation 54 is the amplifier system of any of implementations 50-53, wherein the second amplifier is a switching amplifier and is configurable to operate in the first mode at a first switching frequency and in the second mode at a second switching frequency that is higher than the first switching frequency.

Implementation 55 is the amplifier system of any of implementations 50-54, wherein the second amplifier is configurable to operate in the first mode at a first distortion level and in the second mode at a second distortion level that is lower than the first distortion level.

Implementation 56 is the amplifier system of any of implementations 50-55, wherein the second amplifier is a switching amplifier and the first mode is characterized by soft switching of an output stage of the switching amplifier.

Implementation 57 is the amplifier system of any of implementations 50-56, wherein the second amplifier is a switching amplifier and the first mode is characterized by enforcement of a nonzero DC bias at an output of the switching amplifier.

Implementation 58 is the amplifier system of any of implementations 50-57, further including first delay circuitry configured to delay the input signal before it is amplified by the first amplifier.

Implementation 59 is the amplifier system of implementation 58, wherein the first delay circuitry is programmable to introduce a delay greater than or equal to zero, or wherein the first delay circuitry is configurable to be bypassed.

Implementation 60 is the amplifier system of implementation 58 or 59, further including second delay circuitry configured to delay the input signal before it is amplified by the second amplifier, wherein both the first delay circuitry and the second delay circuitry are independently programmable.

Implementation 61 is the amplifier system of any of implementations 50-60, further including a first chassis and a second chassis, the first amplifier being integrated with the first chassis, and the second amplifier being integrated with the second chassis.

Implementation 62 is the amplifier system of implementation 61, further including one or more sense terminals integrated with the first chassis and configured to provide feedback to the first amplifier from a load driven by the first amplifier.

Implementation 63 is the amplifier system of implementation 61, wherein a load driven by the first amplifier is integrated with the first chassis.

Implementation 64 is the amplifier system of any of implementations 50-63, further including bias modulation circuitry configured to modulate a standing current of the first amplifier based on the input signal to the first amplifier or based on modulation of the power supply rail.

Implementation 65 is the amplifier system of implementation 64, wherein the bias modulation circuitry is configurable to modulate the standing current of the first amplifier based on a specified load impedance.

Implementation 66 is the amplifier system of any of implementations 50-65, wherein the power supply rail is a positive power supply rail and the first amplifier also has a negative power supply rail, the amplifier system further including a third amplifier, the third amplifier being configurable in a first mode to modulate the negative power supply rail of the first amplifier based on the input signal to the first amplifier, the third switching amplifier being configurable in a second mode to operate independently of the first amplifier.

Implementation 67 is the amplifier system of any of implementations 50-66, wherein the second amplifier is configured to modulate the power supply rail of the first amplifier in a substantially continuous manner.

Implementation 68 is the amplifier system of any of implementations 50-66, wherein the second amplifier is configured to drive the power supply rail of the first amplifier to a plurality of discrete voltages.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. An amplifier system, comprising:
a linear amplifier for amplifying an input signal, the linear amplifier having a power supply rail; and
a first switching amplifier, the first switching amplifier being configurable in a first mode to modulate the power supply rail of the linear amplifier based on the input signal to the linear amplifier, the first switching amplifier being configurable in a second mode to for signal amplification, wherein the first switching amplifier is configured to modulate the power supply rail of the linear amplifier only in its first mode.

2. The amplifier system of claim 1, wherein the first switching amplifier is a class D amplifier.

3. The amplifier system of claim 1, wherein the linear amplifier is a class A amplifier, a class B amplifier, or a class AB amplifier.

4. The amplifier system of claim 1, wherein the first switching amplifier is configurable to operate in the first mode at a first average power efficiency and in the second mode at a second average power efficiency that is lower than the first average power efficiency.

5. The amplifier system of claim 1, wherein the first switching amplifier is configurable to operate in the first mode at a first switching frequency and in the second mode at a second switching frequency that is higher than the first switching frequency.

6. The amplifier system of claim 1, wherein the first switching amplifier is configurable to operate in the first mode at a first distortion level and in the second mode at a second distortion level that is lower than the first distortion level.

7. The amplifier system of claim 1, wherein the first mode of the first switching amplifier is characterized by soft switching of an output stage of the first switching amplifier.

8. The amplifier system of claim 1, wherein the first mode of the first switching amplifier is characterized by enforcement of a nonzero DC bias at an output of the first switching amplifier.

9. The amplifier system of claim 1, further comprising first delay circuitry configured to delay the input signal before it is amplified by the linear amplifier.

10. The amplifier system of claim 9, wherein the first delay circuitry is programmable to introduce a delay greater than or equal to zero, or wherein the first delay circuitry is configurable to be bypassed.

11. The amplifier system of claim 10, further including second delay circuitry configured to delay the input signal before it is amplified by the first switching amplifier, wherein both the first delay circuitry and the second delay circuitry are independently programmable.

12. The amplifier system of claim 1, further comprising a first chassis and a second chassis, the linear amplifier being integrated with the first chassis, and the first switching amplifier being integrated with the second chassis.

13. The amplifier system of claim 12, wherein the amplifier system further comprises one or more sense terminals integrated with the first chassis and configured to provide feedback to the linear amplifier from a load driven by the linear amplifier.

14. The amplifier system of claim 12, wherein a load driven by the linear amplifier is integrated with the first chassis.

15. The amplifier system of claim 1, further comprising bias modulation circuitry configured to modulate a standing current of the linear amplifier based on the input signal to the linear amplifier or based on modulation of the power supply rail.

16. The amplifier system of claim 15, wherein the bias modulation circuitry is configurable to modulate the standing current of the linear amplifier based on a specified load impedance.

17. The amplifier system of claim 1, wherein the power supply rail is a positive power supply rail and the linear amplifier also has a negative power supply rail, the amplifier system further comprising a second switching amplifier, the second switching amplifier being configurable in a first mode to modulate the negative power supply rail of the linear amplifier based on the input signal to the linear amplifier, the second switching amplifier being configurable in a second mode for signal amplification, wherein the second switching amplifier is configured to modulate the negative power supply rail of the linear amplifier only in its first mode.

18. The amplifier system of claim 1, wherein the first switching amplifier is configured to modulate the power supply rail of the linear amplifier in a substantially continuous manner.

19. The amplifier system of claim 1, wherein the first switching amplifier is configured to drive the power supply rail of the linear amplifier to a plurality of discrete voltages.

* * * * *